US011231658B2

(12) United States Patent
Kierey et al.

(10) Patent No.: US 11,231,658 B2
(45) Date of Patent: Jan. 25, 2022

(54) ARRANGEMENT FOR AN EUV LITHOGRAPHY APPARATUS

(71) Applicant: Carl Zeiss SMT GmbH, Oberkochen (DE)

(72) Inventors: Holger Kierey, Aalen (DE); Wolfgang Merkel, Neu-Ulm (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 16/882,511

(22) Filed: May 24, 2020

(65) Prior Publication Data

US 2020/0285142 A1    Sep. 10, 2020

Related U.S. Application Data

(63) Continuation of application No. PCT/EP2018/079893, filed on Oct. 31, 2018.

(30) Foreign Application Priority Data

Nov. 27, 2017   (DE) ...................... 10 2017 221 143.1

(51) Int. Cl.
   *G03F 7/20*    (2006.01)
(52) U.S. Cl.
   CPC ................ *G03F 7/70925* (2013.01)
(58) Field of Classification Search
   CPC ............. G03F 7/70925; G03F 7/70908; G03F 7/70916; G02B 27/0006
   See application file for complete search history.

(56) References Cited

U.S. PATENT DOCUMENTS

| 2006/0072084 A1* | 4/2006 | Van Herpen ........... G21K 1/062 355/30 |
| 2007/0125968 A1* | 6/2007 | Klunder .............. G03F 7/70008 250/504 R |

(Continued)

FOREIGN PATENT DOCUMENTS

DE    102008040720 A1    1/2010

OTHER PUBLICATIONS

Research Disclosure, disclosed anonymously, The Industry Standard Disclosure Publication Service, Published Jan. 2014, database No. 597037, 5 pages.

(Continued)

*Primary Examiner* — Steven Whitesell Gordon
(74) *Attorney, Agent, or Firm* — Edell, Shapiro & Finnan LLC

(57) ABSTRACT

An arrangement for an EUV lithography apparatus includes a reflective optical element (60) having an optically effective surface (62) configured to reflect incident EUV radiation, and a filament arrangement (65) configured to produce a reagent that cleans the optically effective surface (62). The filament arrangement (65) has at least one filament (66) configured as a glow or heating element. The at least one filament (66) is arranged along the optically effective surface (62) of the reflective optical element (60) wherein a thickness and/or positioning of the at least one filament (66) are/is chosen so as to minimize an optical influence of the at least one filament (66) in the far field of the EUV radiation reflected by the optically effective surface (62).

17 Claims, 13 Drawing Sheets

(56) References Cited

U.S. PATENT DOCUMENTS

| | | | |
|---|---|---|---|
| 2007/0145295 A1* | 6/2007 | Banine | G03F 7/70925 250/492.2 |
| 2009/0014027 A1* | 1/2009 | Schriever | G03F 7/70925 134/1.1 |
| 2010/0034349 A1* | 2/2010 | Kraus | G03F 7/7085 378/41 |
| 2010/0051827 A1* | 3/2010 | Derra | G03F 7/70166 250/492.1 |
| 2014/0113235 A1 | 4/2014 | Terashima | |
| 2017/0064800 A1 | 3/2017 | Nagai et al. | |
| 2018/0259861 A1* | 9/2018 | Langlois | G03F 7/70033 |
| 2021/0109452 A1* | 4/2021 | Ma | G03F 7/70175 |

OTHER PUBLICATIONS

International Search Report, PCT/EP2018/079893, dated Feb. 21, 2019, 4 pages.

\* cited by examiner

ARRANGEMENT FOR AN EUV LITHOGRAPHY APPARATUS

CROSS REFERENCE TO RELATED APPLICATIONS

This is a Continuation of International Application PCT/EP2018/079893, which has an international filing date of Oct. 31, 2018, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2017 221 143.1 filed on Nov. 27, 2017.

FIELD OF THE INVENTION

The invention relates to an arrangement for an EUV lithography apparatus, comprising a reflective optical element having an optically effective surface configured to reflect incident EUV radiation, and comprising a filament arrangement for producing a reagent that cleans the optically effective surface, wherein the filament arrangement comprises at least one filament configured as a glow or heating element.

BACKGROUND

An arrangement of the type mentioned in the introduction is known from U.S. 2010/0051827 A1.

A lithography apparatus generally serves for producing microstructured semiconductor components, for example. Specifically, with the lithography apparatus, projection radiation is used to image a pattern of a mask onto a wafer. During the lithographic production of semiconductor components, the resolution with which a structure can be imaged onto the substrate (wafer) is sometimes limited by the wavelength of the projection radiation. In order to obtain integrated circuits having a very high structure density and small structure dimensions, it has therefore been proposed to use projection radiation in the extreme ultraviolet spectral range (EUV). EUV radiation can have e.g. a wavelength of approximately 13 nm.

The EUV radiation source is typically a plasma source. In order to produce a plasma, often a so-called target is irradiated with laser light having a long wavelength, wherein tin (Sn), for example, is used as the target. The plasma produced then emits the EUV radiation.

In EUV lithography apparatuses, exclusively reflective optical elements are used as optical elements since there are no lens element materials which transmit radiation in the EUV range. The reflective optical elements present in an EUV lithography apparatus have to have the highest possible reflectivity in order to ensure a sufficiently high total reflectivity of the optical system of the EUV lithography apparatus. The reflectivity and the lifetime of the reflective optical elements can be reduced undesirably by contaminations of the optically effective surfaces of the reflective optical elements. In this case, the collector mirror arranged closest to the target is particularly burdened by contaminations. The collector mirror captures the EUV radiation emanating from the plasma and collects it in order to feed the EUV radiation into the further beam path. In particular, deposits of the target material, for example Sn, and of chemical compounds thereof can form at the optically effective surface of the collector mirror. However, other deposits such as carbon compounds can also deposit on the collector mirror and other reflective optical elements of the lithography apparatus.

In order to clean away contaminations of the optically effective surfaces of reflective optical elements in EUV lithography apparatuses, it is known to bring the optical surfaces into contact with activated hydrogen, i.e. hydrogen that is present for example in the form of $H^*$, $H^+$ and/or $H_2^+$. It is thereby possible to convert contaminations on the optically effective surfaces into readily volatile compounds that no longer adhere to the optically effective surface. A reagent within the meaning of the present invention can be activated hydrogen, for example.

It is desirable for the optically effective surfaces of the optically reflective elements to be able to be cleaned, for example with the aid of activated hydrogen, also during exposure operation of the lithography apparatus. Various approaches are known in the prior art for this purpose. The document U.S. 2010/0051827 A1 cited above describes a nested collector mirror comprising a plurality of mirror shells nested in one another, wherein the optically effective surfaces of the individual mirror shells are operated with grazing incidence. For cleaning away contaminations during operation, it is proposed, inter alia, to arrange a plurality of filaments configured as glow wires on a rear-side surface of the individual mirror shells, i.e. an optically non-effective surface facing away from the optically effective surface of the respective mirror shell, such that the glow wires are situated in the shadow region of the EUV radiation. This is intended to have no adverse effect on the optical performance of the collector mirror. However, this approach is not suitable, or is suitable only to a lesser extent, for non-nested mirrors, in particular for collector mirrors having only one optically effective surface for reflecting the EUV radiation. This is because an arrangement of the filaments on the mirror rear side would not have a sufficient cleaning effect on the optically effective surface.

Other approaches in the prior art, as described in DE 10 2008 040 720 A1, for example, provide one or more cleaning heads comprising a feed for a cleaning gas, for example molecular hydrogen, a glow wire and a discharge for atomic and/or molecular hydrogen, wherein the outlet of the cleaning device is positioned such that it is arranged outside the reflection region of the reflective optical element to be cleaned.

U.S. 2017/0064800 A1 proposes, in the case of a collector mirror configured for normal incidence of the EUV radiation, arranging a plurality of filaments in the form of glow wires outside the optically effective surface in direct proximity to the outer edge region of the optically effective surface of the collector mirror symmetrically around the center of the EUV collector mirror. In that case, the hot glow wires convert molecular hydrogen into activated hydrogen, for example into hydrogen radicals, which etch away Sn that has deposited on the optically effective surface.

Despite the numerous approaches for cleaning optically effective surfaces in EUV lithography apparatuses, there is still a need for an arrangement of the type mentioned in the introduction which is improved with regard to the cleaning effect on the optically effective surface of the reflective optical element.

SUMMARY

With regard to the arrangement mentioned in the introduction, this object is achieved by virtue of arranging at least one filament in direct proximity to and along the optically effective surface of the reflective optical element, wherein a thickness and/or positioning of the at least one filament are/is chosen so as to minimize an optical influence of the at least one filament at least in the far field of the EUV radiation reflected by the optically effective surface.

It was not recognized in the prior art that the etching rate of the reagent produced at a hot filament for cleaning the optically effective surface decreases greatly with increasing distance from the filament. Therefore, the present invention departs from the concept of arranging the filament arrangement outside the optically effective surface. According to the invention, the filament arrangement is arranged in direct proximity to the optically effective surface, which is to be cleaned, of the reflective optical element. The cleaning effect of the filament arrangement is thus significantly improved. Since the filament(s) in the arrangement according to the invention is/are situated in the reflection region of the optically effective surface, in the arrangement according to the invention provision is furthermore made for minimizing the optical influence of the at least one filament through suitable selection of the thickness and/or positioning of the at least one filament at least in the far field of the EUV radiation reflected by the optically effective surface. Positioning here should be understood also to mean the orientation of the at least one filament. "Far field of the EUV radiation reflected by the optically effective surface" should be understood to mean the radiation field or the wavefront of the EUV radiation far away from the reflective optical element. What is crucial is not whether the filament(s) has/have an optical influence on the reflected EUV radiation in direct proximity to the reflective optical element, but rather whether a possible disturbance of the wavefront becomes apparent in the image plane of the imaging system of the EUV lithography apparatus, i.e. in the plane of the wafer to be exposed. Suitable selection of thickness and/or positioning of the at least one filament along the optically effective surface makes it possible to minimize such detrimental optical influences on the reflected EUV radiation to an extent such that the wavefront of the EUV radiation in the wafer plane is within a specification required for the respective case of exposure.

The filament arrangement can comprise a single filament having such a long length that it can be arranged in a manner distributed over the optically effective surface, for example in a meandering fashion. However, the filament arrangement can also comprise a plurality of individual filaments arranged in a manner distributed along the surface, wherein the filaments or a portion of the filaments can be connected to one another.

The arrangement according to the invention is particularly advantageous in the case where the reflective optical element is a collector mirror of an EUV light source, wherein such a collector mirror is, in particular, a collector mirror designed for normal incidence.

In one preferred embodiment, the thickness of the at least one filament is less than 3 mm, preferably less than 2 mm, more preferably less than 1 mm.

The smaller the thickness of the at least one filament, the smaller the optical influence thereof in the far field of the EUV radiation reflected by the optically effective surface.

In a further preferred embodiment, the at least one filament is arranged at a distance in a range of 5 mm to 50 mm from the optically effective surface Spacing apart the at least one filament from the optically effective surface firstly has the advantage of a smaller optical influence on the reflected EUV radiation, and secondly the thermal influence of the at least one filament on the optically effective surface is reduced as a result. The thermal influence can be further reduced or eliminated by suitably cooling the optical element. The spacing apart can be in a range of 5 mm to 30 mm, furthermore in a range of 5 mm to 20 mm.

In a further preferred embodiment, the filament arrangement comprises a plurality of filaments arranged in a manner distributed uniformly along the optically effective surface In this case, it is advantageous that a uniform cleaning effect is established over the optically effective surface. Secondly it is thereby possible also to avoid thermal influences of the filaments on the optically effective surface that are distributed nonuniformly over the optically effective surface.

Preferred embodiments are described below with regard to the positioning of the at least one filament along the optically effective surface.

In one embodiment, the at least one filament is positioned in a manner extending at least substantially radially between a center of the optically effective surface and a radially outer edge region of the optically effective surface.

If the filament arrangement comprises a plurality of filaments, the filament arrangement can be embodied preferably centrally radially symmetrically with respect to the center of the optically effective surface.

In a further embodiment, the at least one filament is positioned in a manner extending at least substantially circularly or partly circularly around the center of the optically effective surface.

A filament arrangement that is rotationally symmetrical with respect to the center can be provided as a result.

In yet another embodiment, the at least one filament is positioned in a manner extending at least substantially tangentially with respect to the center of the optically effective surface.

In connection with the abovementioned embodiment and/or the embodiment mentioned further above of radial positioning, in the case where the reflective optical element is arranged upstream of a facet mirror during operation in a lithography apparatus, said facet mirror comprising facets having a larger dimensioning in a first direction than in a second direction perpendicular to the first direction, it is advantageous if the at least one filament extends in a direction at least substantially parallel to the first direction of the facets along the optically effective surface.

It has been found that the optical influence in the case of rectilinear positioning of the at least one filament is particularly small or negligible if the filament(s) extend(s) in the direction of the longer dimension of the facets of the facet mirror.

The optical influence can also be minimized by the at least one filament extending along a region of the optically effective surface which reflects a part of the EUV radiation that is not used in the far field.

This measure can make use of the fact that the EUV radiation reflected by the optically effective surface does not contribute in its entirety to the imaging into the wafer plane. This is the case, for example, if there are arranged in the further beam path of the EUV radiation segmented reflective optical elements, such as the facet mirrors already mentioned, for example, which comprise non-reflective regions, such as gaps between mirror segments, for example, such that that part of the EUV radiation which is incident on the non-reflective regions is not guided further in the direction of the wafer plane. By tracing back the beam path from the non-reflective regions to the optical element—in particular collector mirror—to be cleaned, it is possible to determine the regions on the optically effective surface to be cleaned in which the filament(s) can be arranged, without a disturbing optical influence being manifested in the far field.

In further embodiments, the at least one filament is configured as a resistance heating element.

The configuration of the at least one filament as a resistance heating element with a corresponding voltage and/or current supply has the advantage over other ways of heating the filament(s), such as with thermal radiation, for example, in that the filaments can be heated to very high temperatures and the reagent, e.g. activated hydrogen, can thus be produced effectively. Moreover, stray heat effects as a result of external heating systems are avoided. The filament(s) can be operated with DC voltage or with AC voltage.

What may be considered to be suitable material for the filaments is, in particular, a material that does not evaporate, or evaporates only little, at high temperatures, such as tungsten, for example.

It is furthermore advantageous if the at least one filament is connected to at least one electrical supply conductor for supplying the at least one filament with electric current, wherein the at least one supply conductor is preferably configured as a holder for the at least one filament.

In this case, the electrical supply conductor(s) can have a greater thickness than the at least one filament. By way of example, a filament can have a thickness of 1 mm, and the electrical supply conductor can have a thickness of up to 3 mm. The supply conductor(s) can advantageously be configured as wires.

In a further preferred embodiment, the at least one supply conductor extends along the optically effective surface radially between a center and a radially outer edge region of the optically effective surface.

This arrangement of the at least one supply conductor can advantageously be chosen for one of the abovementioned embodiments of the positioning of the at least one filament according to which the filament(s) likewise extend(s) radially, or in which the filament(s) extend(s) circularly or partly circularly around the center of the optically effective surface.

The polarities of the electrical voltage between respectively adjacent supply conductors can alternate, which has the advantage that electric fields caused by the supply conductors cancel one another out, or the polarities of the electrical voltage can be identical among the supply conductors, which has the advantage that a connection of identical polarity can be used for a plurality of supply conductors, which simplifies the construction because the number of required connections decreases.

In one of the abovementioned embodiments with regard to the positioning of the at least one filament in which the filament(s) extend(s) along the optically effective surface linearly, that is to say in a straight fashion, the supply conductor(s) preferably also extend(s) along the optically effective surface in a straight fashion, but perpendicularly to the filaments.

However, in contrast to the filaments, the electrical supply conductors can also be arranged completely outside the optically effective surface, as provided in a further preferred embodiment. In this embodiment, the electrical supply conductors have no optical influence whatsoever on the EUV radiation that is reflected by the optically effective surface. In connection with the embodiment mentioned above, one or more additional electrically insulating or electrically non-conductive holding elements for holding the at least one filament in position can be arranged along the optically effective surface. The additional holding element(s) serve(s) for stabilizing the arrangement and positioning the at least one filament.

Preferably, the filament(s) is/are operated with a bias voltage, which prevents charged particles, in particular ions, from being accelerated toward the optically effective surface, which could result in the optically effective surface being damaged.

An EUV lithography apparatus according to the invention comprises an arrangement according to one or more of the embodiments mentioned above.

Further advantages and features are evident from the following description and the attached drawing.

The aforementioned features and those yet to be explained below can be used not only in the combination specified in each case but also in other combinations or on their own, without departing from the scope of the present invention.

Exemplary embodiments of the invention are illustrated in the drawing and described in more detail with reference thereto. In the Figures:

BRIEF DESCRIPTION OF THE DRAWINGS

FIGS. 2A and 2B show a reflective optical element with an arrangement of filaments in accordance with one exemplary embodiment, wherein FIG. 2A shows a plan view of the reflective optical element and FIG. 2B shows the reflective optical element in cross section;

FIGS. 3A and 3B show a reflective optical element with an arrangement of filaments in accordance with a further exemplary embodiment, wherein FIG. 3A shows a plan view of the reflective optical element and FIG. 3B shows the reflective optical element in cross section;

FIGS. 4A and 4B show a reflective optical element with an arrangement of filaments in accordance with a further exemplary embodiment, wherein FIG. 4A shows a plan view of the reflective optical element and FIG. 4B shows the reflective optical element in cross section;

FIGS. 5A and 5B show a reflective optical element with an arrangement of filaments in accordance with a further exemplary embodiment, wherein FIG. 5A shows a plan view of the reflective optical element and FIG. 5B shows the reflective optical element in cross section;

FIGS. 6A and 6B show a reflective optical element with an arrangement of filaments in accordance with a further exemplary embodiment, wherein FIG. 6A shows a plan view of the reflective optical element and FIG. 6B shows the reflective optical element in cross section;

FIGS. 11A and 11B show a reflective optical element with an arrangement of filaments in accordance with a further exemplary embodiment, wherein FIG. 11A shows a plan view of the reflective optical element and FIG. 11B shows the reflective optical element in cross section;

FIGS. 12A and 12B show a reflective optical element with an arrangement of filaments in accordance with a further exemplary embodiment, wherein FIG. 12A shows a plan view of the reflective optical element and FIG. 12B shows the reflective optical element in cross section; and FIGS. 13A and 13B show a reflective optical element with an arrangement of filaments in accordance with a further exemplary embodiment, wherein FIG. 13A shows a plan view of the reflective optical element and FIG. 13B shows the reflective optical element in cross section.

DETAILED DESCRIPTION

Figure 1:
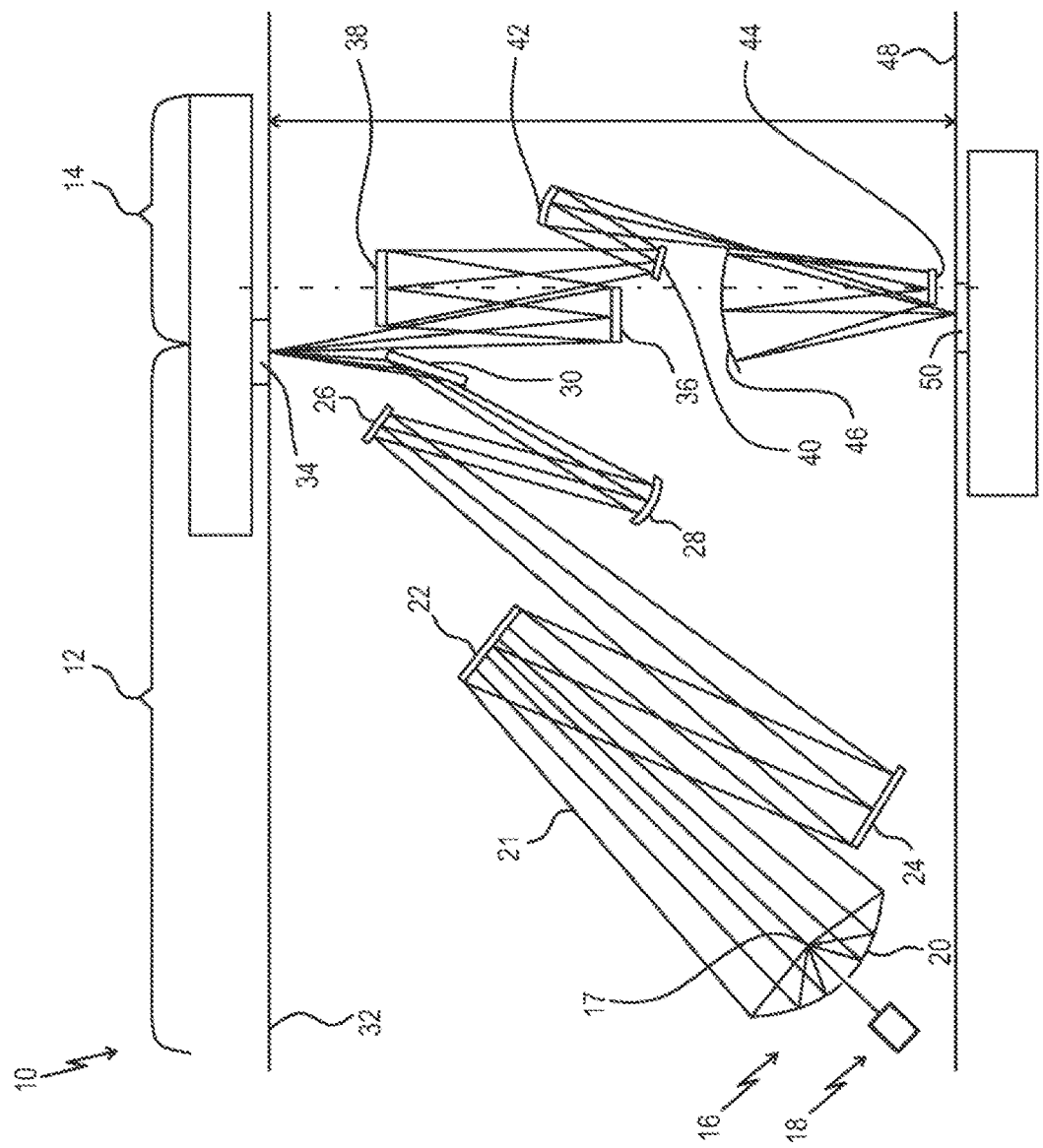
FIG. 1 shows a basic illustration of an EUV lithography apparatus.

FIG. 1 shows an EUV lithography apparatus provided with the general reference sign 10. The EUV lithography apparatus 10 can be used for producing finely structured semiconductor components.

The EUV lithography apparatus 10 comprises an illumination system 12 and a projection lens 14. The illumination system 12 comprises an EUV radiation source 16. The EUV radiation source 16 is a plasma-based radiation source, for example, in which a target 17 formed by tin (Sn) dopants, for example, is excited by an excitation light source 18, for example an infrared laser, to form a plasma. The plasma produced emits EUV radiation, which is collected by a collector mirror 20 and fed to an EUV beam path 21.

The illumination system comprises further mirrors 22, 24, 26, 28 and 30 in the direction of propagation of radiation, via which mirrors the EUV radiation generated by the EUV radiation source 16 is directed into an object plane 32, in which a reflective reticle 34 is arranged.

In the direction of propagation of the EUV radiation, the projection lens 14 comprises a mirror arrangement comprising mirrors 36, 38, 40, 42, 44 and 46, via which a pattern (not illustrated here) of the reticle 34 is imaged into an image plane 48, in which a wafer 50, for example a semiconductor substrate, is arranged.

It is evident from the description above that the EUV lithography apparatus 10 has, as optical elements, exclusively reflective optical elements, designated as mirrors.

For the performance of the EUV lithography apparatus it is important that the reflective optical elements, that is to say the mirrors mentioned above, have the highest possible reflectivity in order to ensure a sufficiently high total reflectivity of the optical system of the EUV lithography apparatus 10. However, the reflectivity and the lifetime of the reflective optical elements can be reduced undesirably by contaminations of the optically effective surfaces of the reflective optical elements.

Contaminations of this type can include for example carbon compounds, but also deposits of atomic compounds of the target material of the target 17. It is therefore important for contaminations of this type to be cleaned away from the optically effective surfaces, wherein cleaning away should be rendered possible in particular during the operation of the EUV lithography apparatus 10 (in-situ cleaning). For this purpose, a description is given below of exemplary embodiments of reflective optical elements which make it possible to clean away contaminations during the operation of the EUV lithography apparatus 10.

The basic principle of the exemplary embodiments described here consists in a filament arrangement comprising at least one or a plurality of filaments configured as heating or glow wires, wherein the filament(s) is/are arranged along the optically effective surface of the reflective optical element to be cleaned in order to produce a reagent in direct proximity to the optically effective surface. This facilitates the ability to clean the optically effective surface in situ. In this case, the reagent to be produced is for example activated hydrogen produced from molecular hydrogen with the filament(s), which is/are hot during operation. It should be noted that the filament(s) need not be caused to glow permanently, rather this can also be done at time intervals.

Since the filament(s) is/are arranged in direct proximity to and along the optically effective surface of the reflective optical element to be cleaned, they should nevertheless have the smallest possible optical influence on the EUV radiation reflected by the optically effective surface in the far field, in particular in the image plane 48 of the EUV lithography apparatus 10.

Figure 2A:
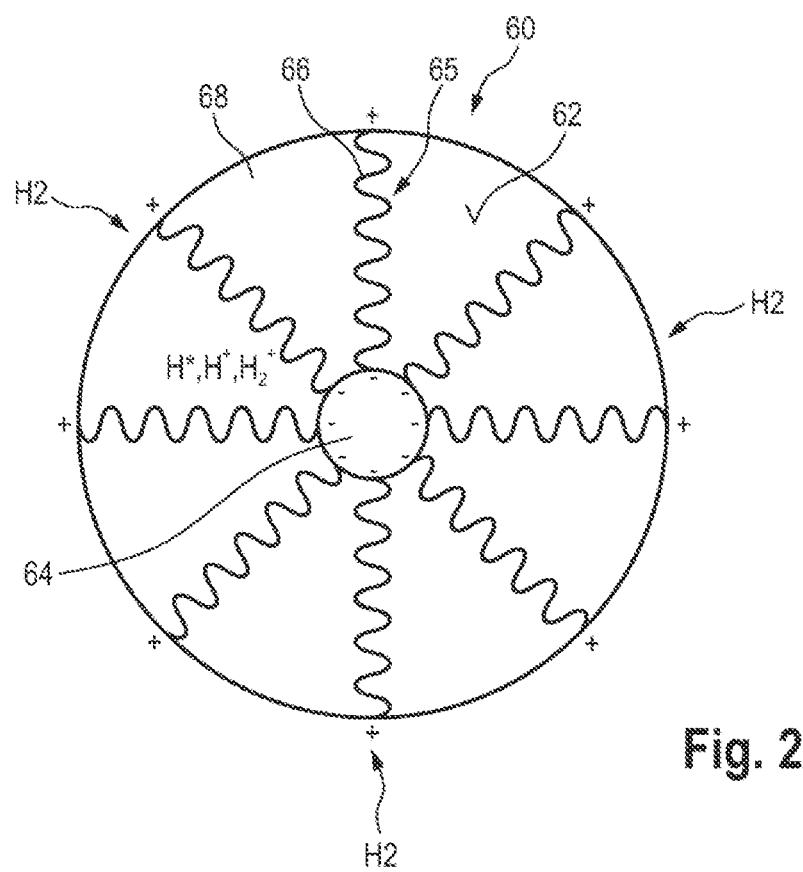
Figure 2B:
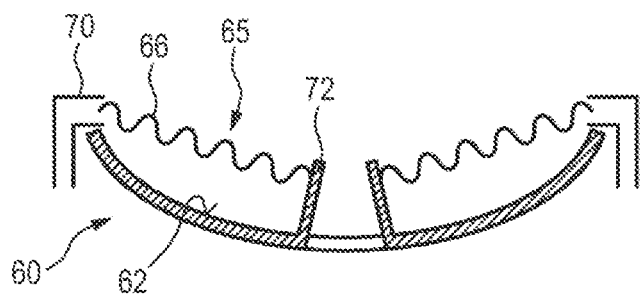

FIGS. 2A and 2B show one exemplary embodiment of an arrangement comprising a reflective optical element 60 in accordance with the principles of the present invention. Without any restriction of generality, the reflective optical element 60 can be, in particular, the collector mirror 20 of the EUV lithography apparatus 10 in FIG. 1. On account of its proximity to the target 17, the collector mirror 20 is especially burdened by contaminations as a result of deposits of the target material of the target 17.

The reflective optical element 60 has an optically effective surface 62. In the exemplary embodiment shown here, in which the reflective optical element 60 is the collector mirror 20 of the EUV lithography apparatus 10, the optically effective surface 62 has a center 64, at which the optically effective surface 62 has a perforation, through which the excitation light from the excitation light source 18 can pass. The optically effective surface 62 of the optical element 60 is shaped concavely, in such a way that EUV radiation incident on the surface 62 is reflected convergently. The element 60 is operated with normal incidence.

A plurality of filaments 66 of a filament arrangement 65 are arranged in a manner distributed uniformly along the optical effective surface 62, said filaments being configured as glow or heating wires. In the exemplary embodiment shown, a total of eight filaments 66 are arranged in a manner distributed along the optically effective surface 62.

In this case, the filaments 66 are positioned such that they extend radially between the center 64 and an outer edge region 68 of the optically effective surface 62.

The glow wires 66 can be embodied in a coiled fashion, as shown here, wherein the coils should not bear closely against one another, rather there is a gap between respectively adjacent coils. The shading effect of the filaments 66 on the optically effective surface 62 is reduced as a result.

In this case, the thickness of the individual filaments 66 is chosen to be as small as possible; the thickness of the filaments 66 should at least be in each case less than 3 mm, preferably even less than 2 mm or even more preferably less than 1 mm.

The filaments 66 can be produced from a material which does not tend toward evaporation even at very high temperatures. A suitable material is tungsten, for example.

As is evident from FIG. 2B, the filaments 66 are spaced apart from the optically effective surface 62, a distance of approximately 1 cm being suitable. Generally the distance can be chosen to be in a range of 5 mm to 50 mm.

Figure 3A:
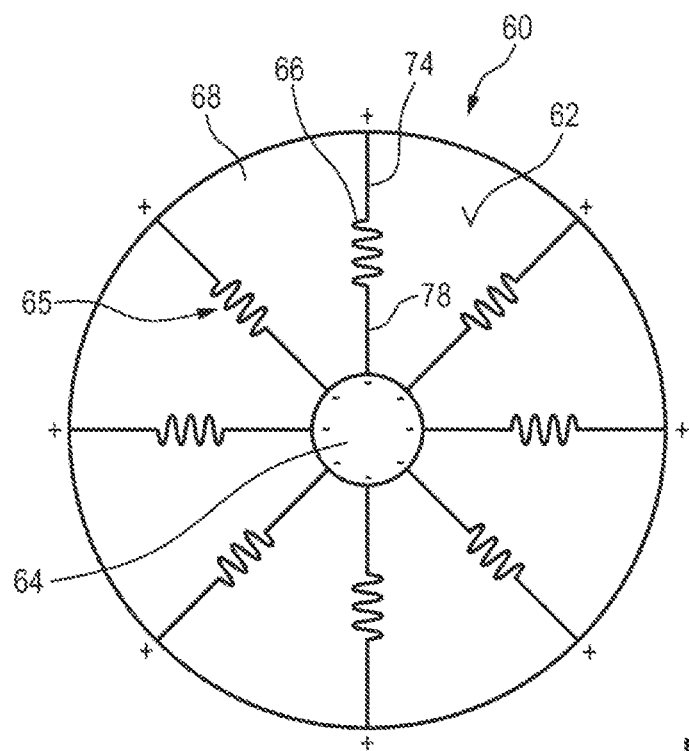

The filaments 66 are configured as resistance heating elements and an electrical voltage is applied to them by a voltage supply source (not shown), wherein the voltage can be DC voltage or AC voltage. In FIG. 3A, by way of example, the polarity or the potential distribution of the voltage supply is shown by "+" and "−". In the exemplary embodiment shown, the polarities of the electrical voltage are identical among the filaments 66, thereby simplifying the electrical contacting of the filaments 66 firstly at the center 64 and secondly in the edge region 68.

The arrangement of the filaments 66 in the exemplary embodiment in accordance with FIGS. 2A and 2B constitutes a centrosymmetrical arrangement in which the filaments 66 are arranged in a manner distributed along the optically effective surface 62 at a uniform distance, which here should be understood to mean the angular distance, with respect to one another.

The filaments 66 can be secured to a mount 70 in the edge region 68, and to a ring-shaped web 72 in the region near the center, said web bounding the perforation at the center 64.

As a result of molecular hydrogen $H_2$, for example, being applied to the surroundings of the reflective optical element 60, activated hydrogen $H^*$, $H^+$, $H_2^+$, for example, is produced at the filaments 66 when the latter are heated by current flow. The activated hydrogen thereby cleans away contaminations, for example deposits of the target material of the target 17, by etching by virtue of the deposits being converted into volatile compounds.

Figure 3B:
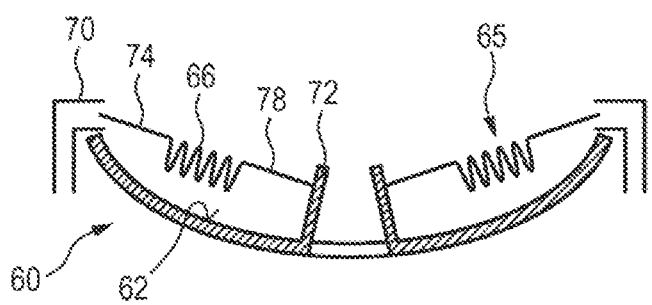

FIGS. 3A and 3B show a further exemplary embodiment, wherein reference signs identical to those in FIGS. 2A and 2B have been used for elements identical or comparable to those in FIGS. 2A and 2B.

While the filaments 66 in the exemplary embodiment in FIGS. 2A and 2B extend over the entire radial extent of the optically effective surface 62, the filaments 66 of the filament arrangement 65 in FIGS. 3A and 3B are made shorter, that is to say do not extend over the entire radial extent of the optically effective surface 62 along the optically effective surface 62 between the center 64 and the edge region 68. This can have a positive effect with regard to the optical influence of the filaments 66. The filaments 66 are connected to electrical supply conductors 74 and 78, which supply the filaments 66 with electric current, and which additionally hold the filaments 66 in position at a distance from the optically effective surface 62. The supply conductors 74, which can be configured as wires, thus have the function of retaining the filaments 66 and supplying current thereto. The supply conductors 74, 78 can have a greater thickness than the filaments 66. On account of their lower resistance, the conductors 74, 78 are left unheated or only slightly heated by the current flow.

Like the filaments 66, the supply conductors 74, 78 extend radially between the center 64 and the radially outer edge region 68.

Figure 4A:
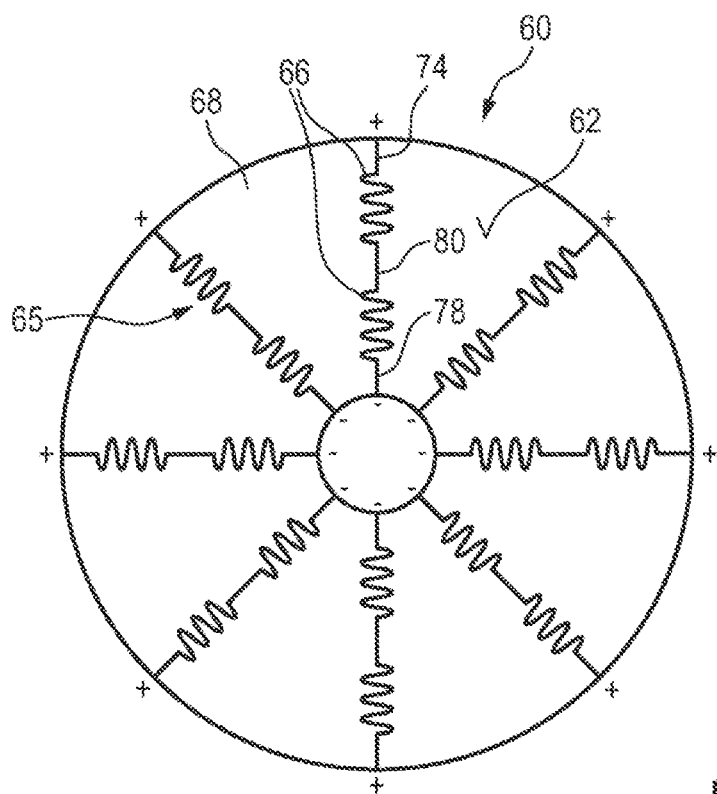
Figure 4B:
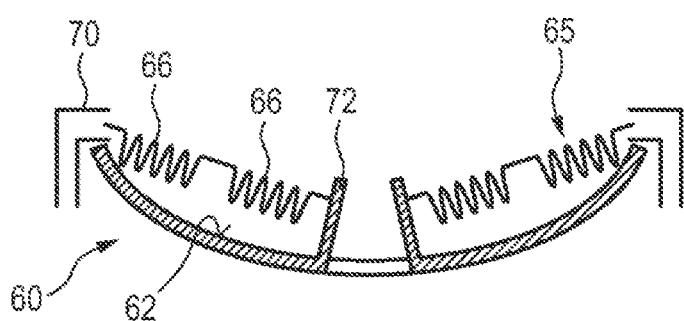

FIGS. 4A and 4B show a further exemplary embodiment, wherein once again identical reference signs have been used for elements identical or comparable to those in FIGS. 2A and 2B.

In the exemplary embodiment in FIGS. 4A and 4B, in a radial direction in each case two filaments 66 of the filament arrangement 65 are arranged in series, said filaments being interconnected via an additional supply conductor 80. By virtue of such an arrangement, the cleaning effect of the filaments 66 can be increased by comparison with the previous exemplary embodiment, while the optical influence of the filaments 66 is smaller by comparison with the exemplary embodiment in FIGS. 2A and 2B.

Figure 5A:
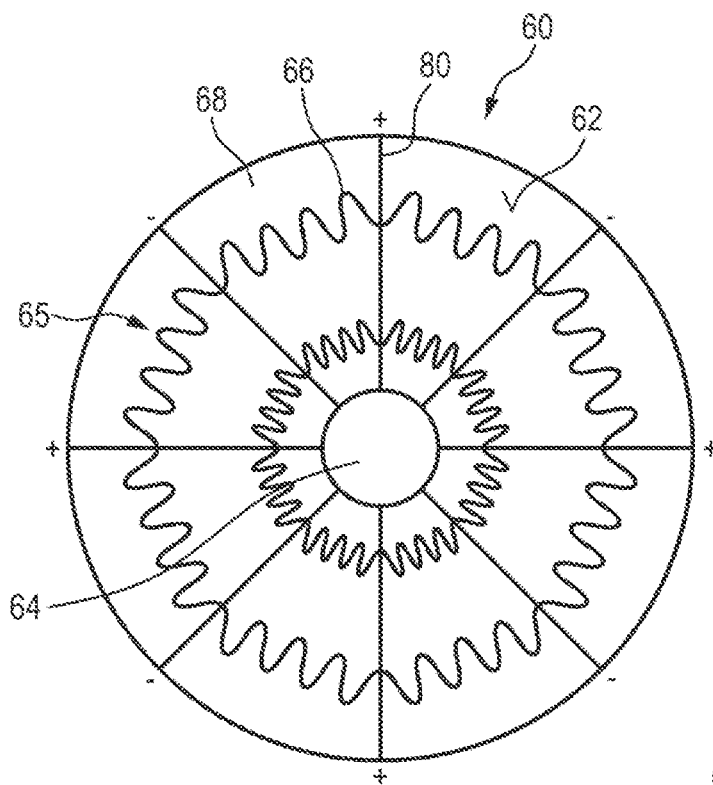
Figure 5B:
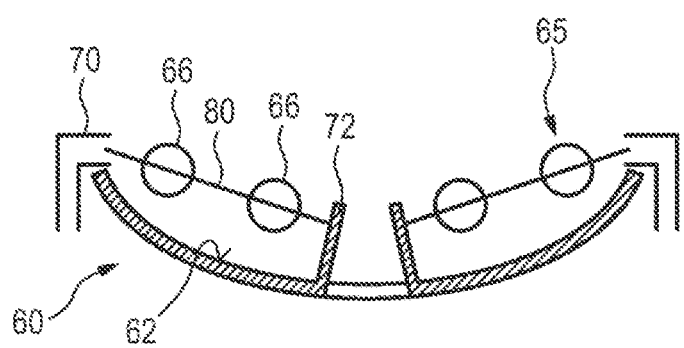

FIGS. 5A and 5B show a further exemplary embodiment, wherein once again the identical reference signs have been used for elements identical or comparable to those in FIGS. 2A and 2B.

While centrosymmetrical filament arrangements 65 are shown in the exemplary embodiments in accordance with FIGS. 2A, 2B, 3A, 3B and 4A, 4B, in the exemplary embodiment in accordance with FIGS. 5A and 5B, the filaments 66 are arranged in a manner distributed along the optically effective surface 62 rotationally symmetrically around the center 64. In this case, the filaments 66 extend circularly around the center 64 of the optically effective surface 62. The filaments 66 thus extend along circular lines along the optically effective surface 62.

For retaining the filaments 66, electrical supply conductors 80 extending radially between the radially outer edge region 68 and the center 64 in each case are arranged in a manner distributed along the optically effective surface 62. The polarities ("+" "−") here alternate between respectively adjacent conductors from among the conductors 80.

Figure 6A:
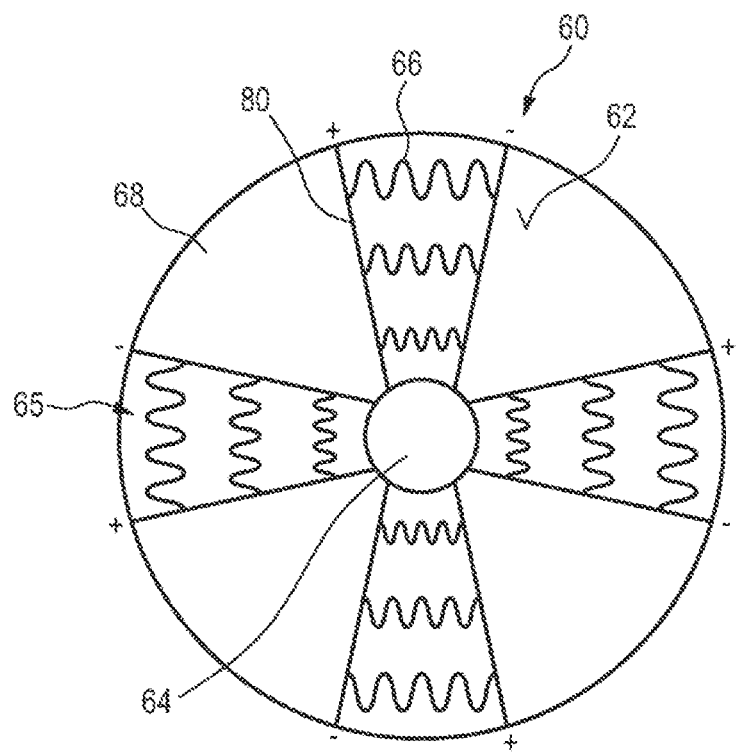
Figure 6B:
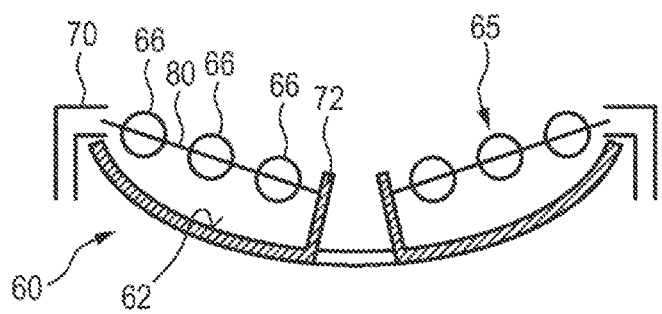

FIGS. 6A and 6B show a further exemplary embodiment, wherein once again identical reference signs have been used for elements identical or comparable to those in FIGS. 2A and 2B.

In contrast to the exemplary embodiment in FIGS. 5A and 5B, the filaments 66 of the filament arrangement 65 are arranged in a manner distributed along the optically effective surface 62 only along partial circular lines rather than along a respective full circular line, wherein the filaments 66 are arranged in four sectors along the optically effective surface 62.

The electrical conductors 80 for supplying the filaments 66 with current extend radially between the center 64 and the radially outer edge region 68 and additionally serve for retaining the filaments 66 at a distance from the optically effective surface 62.

A description is given below of how the positioning, including orientation, and the thickness of the filaments 66 affect the optical influence of the at least one filament 66 on the EUV radiation reflected by the optically effective surface 62 in the far field.

In an EUV lithography apparatus such as the EUV lithography apparatus 10 in FIG. 1, typically at least one facet mirror is used for setting a desired type of illumination of the reticle 34 in the object plane 32. A field facet mirror and a pupil facet mirror are usually used. By way of example, the mirror 22 in FIG. 1 can be a facet mirror.

Figure 7:
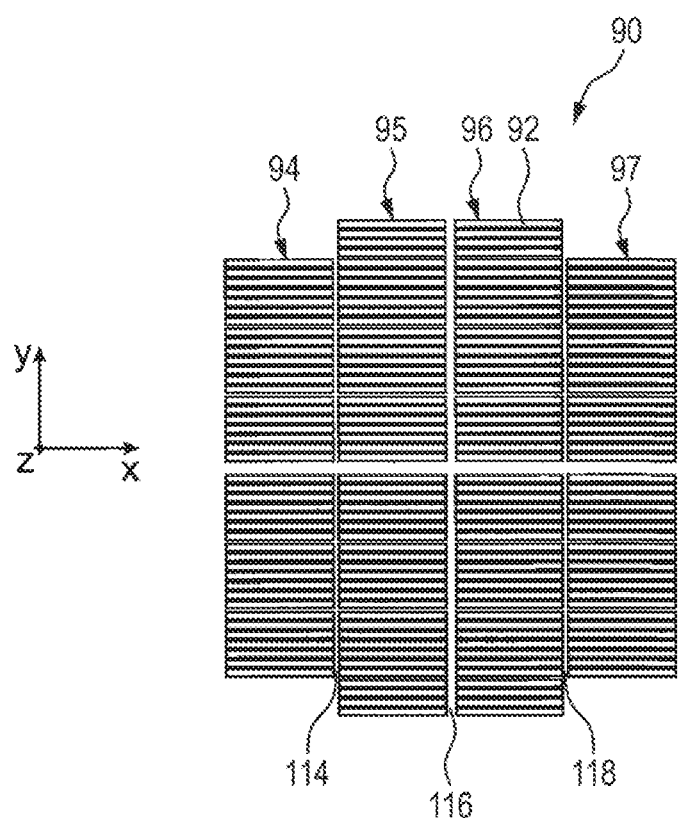
FIG. 7 shows a facet arrangement of a facet mirror of an EUV lithography apparatus in accordance with one example.

FIG. 7 shows by way of example a facet arrangement 90 of a facet mirror. The facet arrangement 90 comprises a multiplicity of individual facets 92, which are shown as white rectangles in FIG. 7. The facets have an extent in a first direction (x-direction) that is greater than its extent in a second direction (y-direction). The facets 92 predefine a reflection surface and, as shown here, can be grouped in four columns each having six to eight facet groups 94, 95, 96, 97. The facet groups 94, 95, 96, 97 each have seven facets 92, for example.

Figure 8:
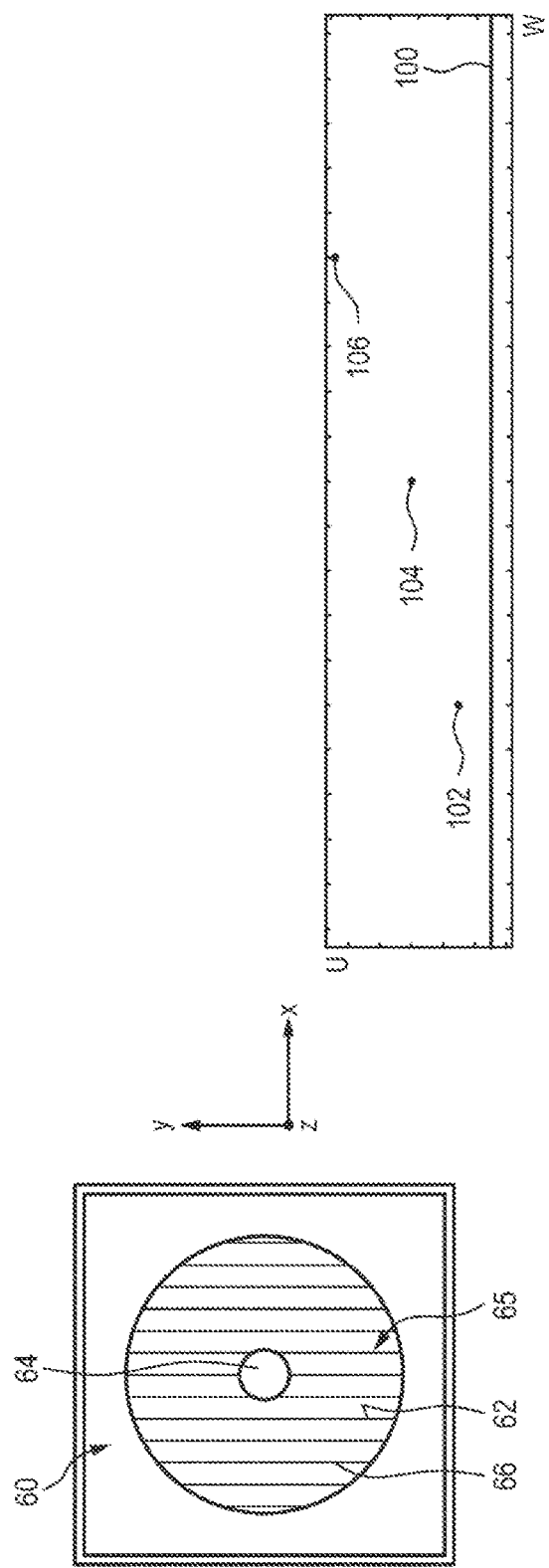
FIG. 8 shows on the left a reflective optical element with an arrangement of filaments and on the right a diagram illustrating the optical influence of the filaments on the EUV radiation reflected by the reflective optical element in an image plane.
Figure 9:
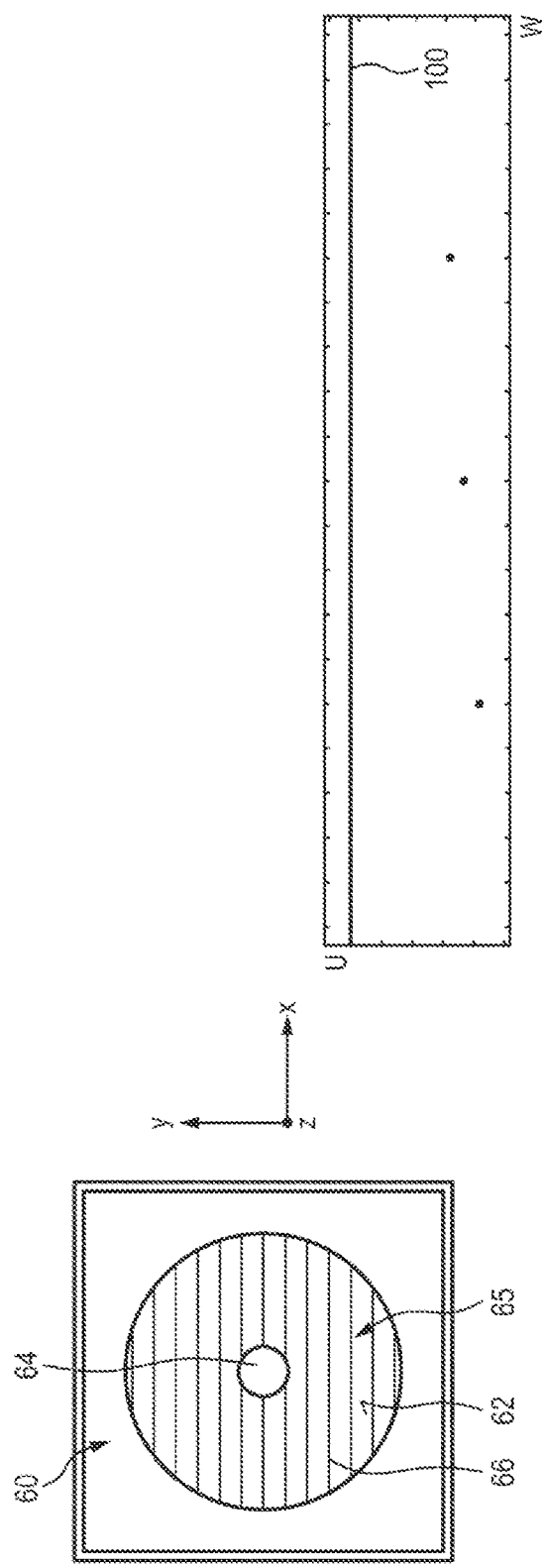
FIG. 9 shows on the left a reflective optical element with an arrangement of filaments and on the right a diagram illustrating the optical influence of the filaments on the EUV radiation reflected by the reflective optical element in an image plane.
Figure 10:
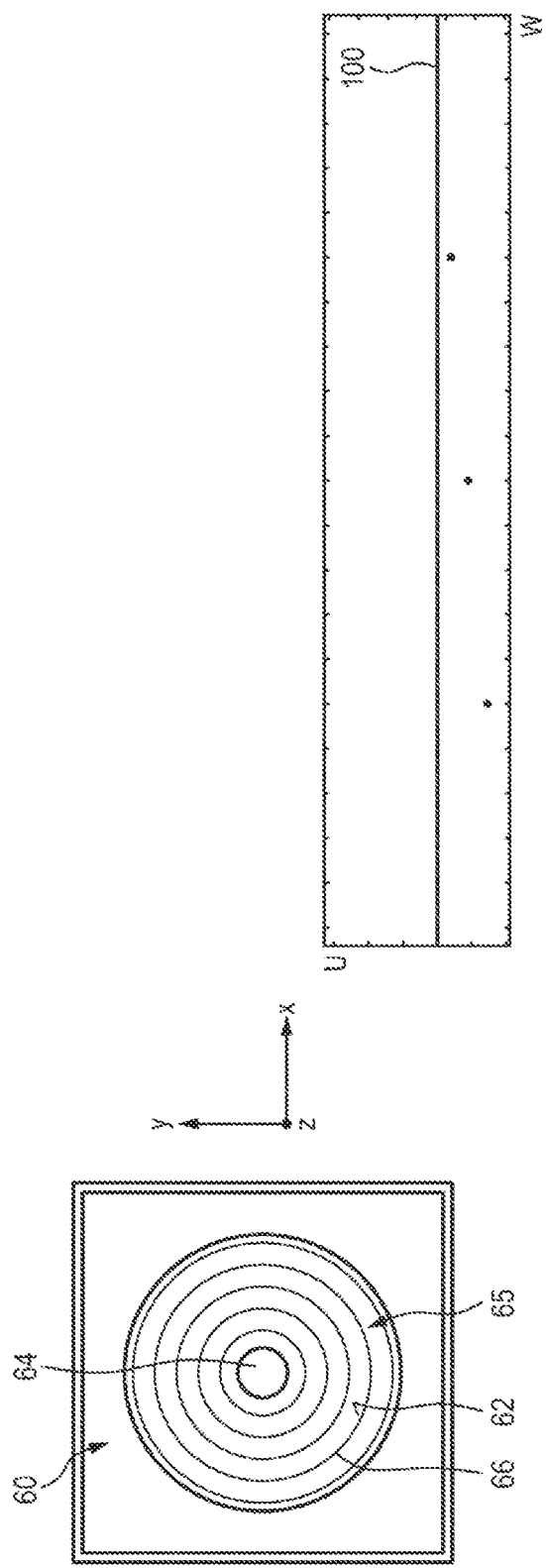
FIG. 10 shows on the left a reflective optical element with an arrangement of filaments and on the right a diagram illustrating the optical influence of the filaments on the EUV radiation reflected by the reflective optical element in an image plane.

With reference to FIGS. 8 to 10, a description is given below of what optical influence the positioning of the filaments 66 and the thickness thereof have on the EUV radiation reflected by the optically effective surface 62 in the far field, in particular in the image plane 48 of the EUV lithography apparatus, if a facet mirror comprising a facet arrangement as shown in FIG. 7, for example, is situated in the EUV beam path.

FIG. 8 shows the case where the filaments 66 extend parallel to the shorter dimension of the facets 92, i.e. in the y-direction.

FIG. 8 shows on the right a diagram showing the uniformity U of the EUV radiation reflected by the optically effective surface 62 of the collector mirror 20 in the wafer plane W (abscissa).

A line 100 indicates the specification required for the uniformity U. The diagram depicts the U-values of the EUV radiation in the wafer plane for a filament thickness of 1 mm (point 102), of 2 mm (point 104) and of 3 mm (point 106). As is evident from the diagram, the values for U lie outside the required specification for all filament thicknesses 1 mm, 2 mm, 3 mm, that is to say that the imaging in the wafer plane W does not fulfil the required specification for all three filament thicknesses. It is evident also that as the thickness of the at least one filament 66 increases, the imaging values increasingly fail to comply with the specification.

FIG. 9 then shows the case where the filaments 66 extend parallel to the longer dimension (x-direction) of the facets 92 in FIG. 7. The diagram for the parameter U then shows that the uniformity U of the EUV radiation reflected by the optically effective surface 62 of the collector mirror 20 in the wafer plane W lies within the specification (line 100) even for a thickness of the at least one filament 66 of 3 mm (right-hand point in the diagram), that is to say that the imaging in the wafer plane W fulfils the required specification given this orientation of the at least one filament 66. In other words, the optical influence of the filaments 66 given the positioning parallel to the longer dimension of the facets 92 in the far field of the EUV radiation reflected by the optically effective surface 62 is minimal, such that the required specification of the imaging is fulfilled.

FIG. 10 shows the case where the filaments 66 extend circularly around the center 64 of the optically effective surface 62.

It is evident from the diagram in FIG. 10 that the specification for U (line 100) can be approximately fulfilled at least in the case of a thickness of the filaments 66 of 1 mm (left-hand point in the diagram).

Figure 11A:
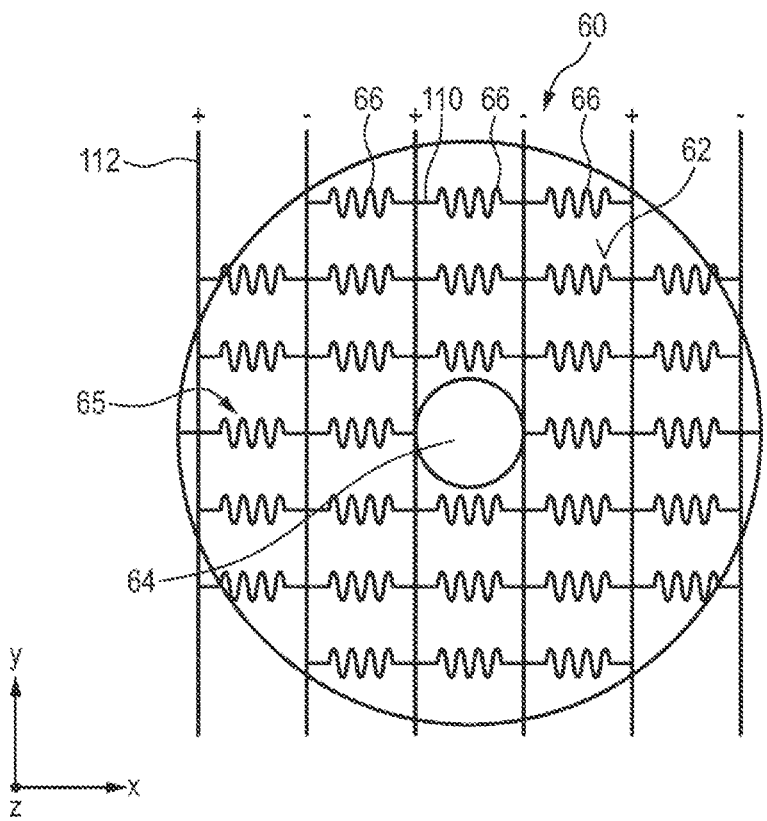
Figure 11B:
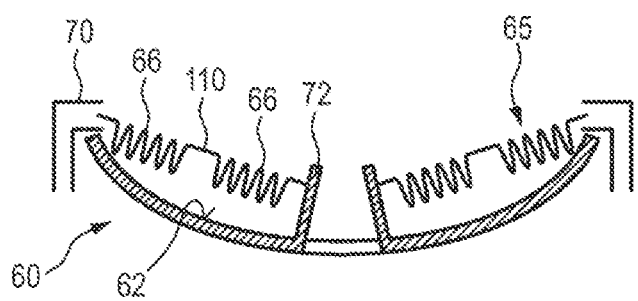

FIGS. 11A and 11B show a further exemplary embodiment of a reflective optical element 60, wherein identical reference signs have been used for elements identical or comparable to those in FIGS. 2A and 2B.

In the exemplary embodiment in FIGS. 11A and 11B, the filaments 66 of the filament arrangement 65 extend in a straight fashion and tangentially with respect to the center 64 of the optically effective surface 62, wherein the direction of the filaments 66 can be directed parallel to the x-direction of the longer dimension of the facets 92. As has been described above with reference to FIG. 9, such positioning of the filaments 66 is advantageous with regard to a possible optical influence on the EUV radiation in the far field and thus on the imaging into the image plane 48 of the EUV lithography apparatus 10. Electrical supply conductors 110 interconnect the filaments 66 and keep them at a distance from the optically effective surface 62 (see FIG. 11B). Further supply conductors 112 extending perpendicularly to the filaments 66 likewise serve to supply the filaments 66 with current, the polarities of the connections being illustrated by "+" and "−", and they can furthermore serve for holding the filaments 66 in position. Since the conductors 112 extend perpendicularly to the direction of the longer extent of the facets 92, that is to say in the y-direction, they can advantageously be positioned such that they are arranged in gaps 114, 116, 118 (see FIG. 7) between the respective facet groups 94, 96, as a result of which their optical influence is likewise minimized.

This latter positioning principle can also be used for the filaments 66 themselves in other exemplary embodiments, by virtue of the filaments being positioned such that they extend along one or more regions of the optically effective surface 62 by which a part of the EUV radiation that is not used in the far field is reflected.

Figure 12A:
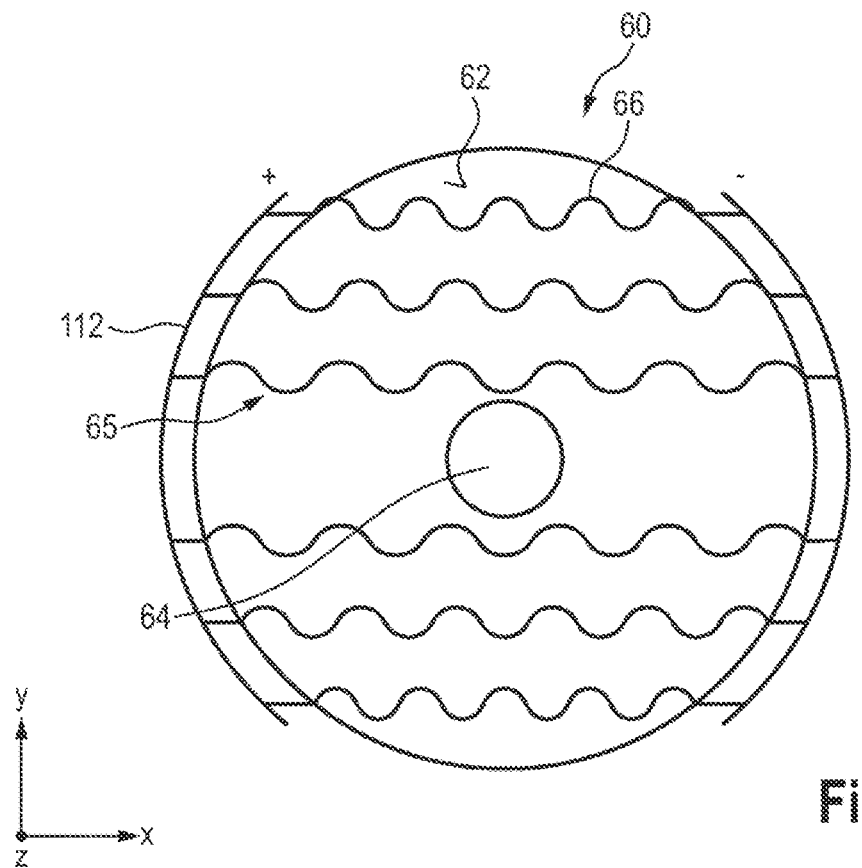
Figure 12B:
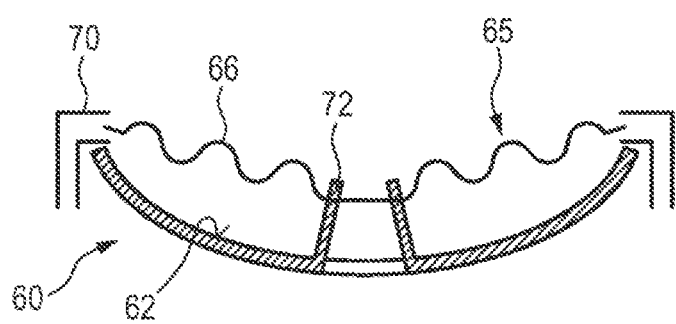

FIGS. 12A and 12B show a modification of the exemplary embodiment in FIGS. 11A and 11B in which the filaments 66 of the filament arrangement 65, as in FIGS. 11A and 11B, extend in a straight fashion and tangentially with respect to the center, for example in the direction of the longer extent of the facets 92 in FIG. 7 (x-direction), wherein, in contrast to the previous exemplary embodiment, the filaments 66 now are embodied continuously in each case along the optically effective surface 62, while the current supply via the supply conductors 112 is transferred to outside the optically effective surface 62. Elements above the optically effective surface 62 which extend in the y-direction can be avoided as a result. This arrangement of filaments 66 and supply conductors 112 is advantageous for example if the conductors 112 shown in FIG. 11A cannot be positioned such that they fall optically into the gaps 114, 116, 118 of the facet arrangement 90.

Figure 13A:
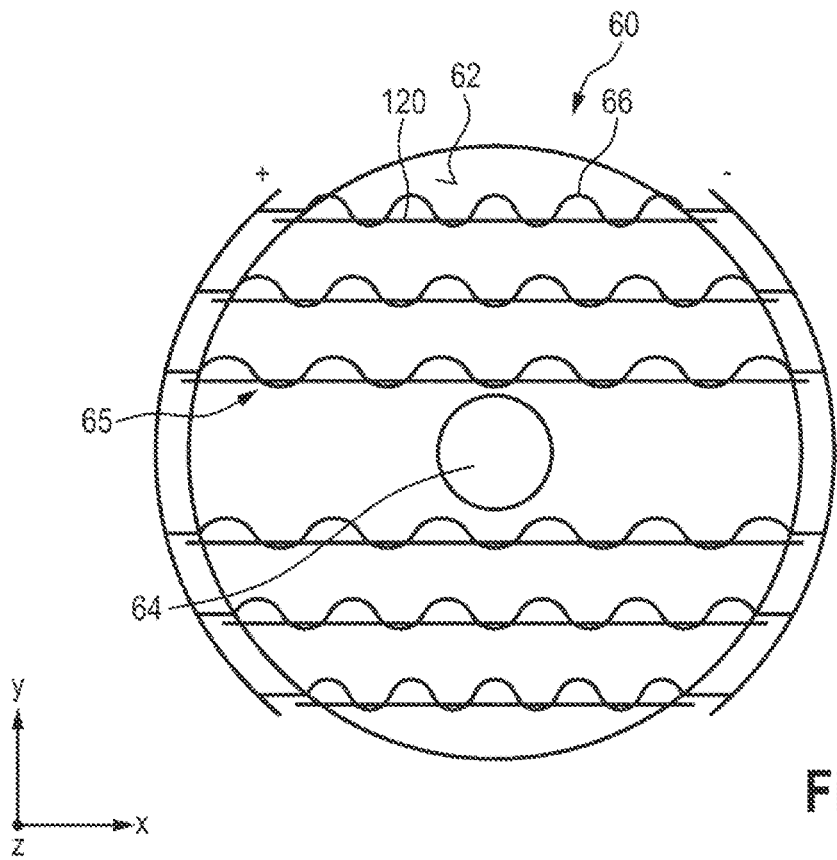
Figure 13B:
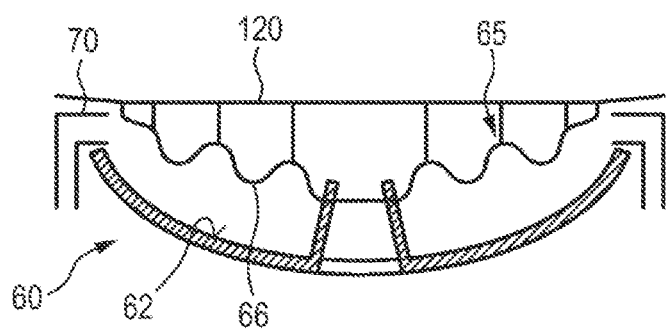

FIGS. 13A and 13B show a modification of the exemplary embodiment in FIGS. 12A and 12B, wherein once again identical reference signs have been used for elements identical or comparable to those in FIGS. 12A and 12B. In the exemplary embodiment in FIGS. 12A and 12B, in the case of filaments 66 having a long length, it can happen that they are supported insufficiently between their holding points (mount 70 and ring web 72), and they can touch the optically effective surface 62. In the exemplary embodiment in FIGS. 13A and 13B, in order to solve this problem, additional holding wires 120 are provided, at which the filaments 66 are held, in particular as is discernible in FIG. 13B. The holding wires 120 are not electrically conductive, but rather configured as insulators, or configured as metal wires with an insulation on the exterior. Like the filaments 66, the holding wires 120 can advantageously extend in the x-direction, that is to say in the direction of the longer dimension of the facets 92 in FIG. 7, as a result of which their optical influence in the far field on the EUV radiation or on the imaging into the image plane 48 by the EUV radiation is minimized, as has been described with reference to FIG. 8.

What is claimed is:

1. An arrangement for an extreme ultraviolet (EUV) lithography apparatus, comprising:
    a reflective optical element having an optically effective surface configured to reflect incident EUV radiation, and
    a filament arrangement configured to produce a reagent that cleans the optically effective surface, wherein the filament arrangement comprises at least one filament configured as a glow or heating element, wherein the at least one filament is arranged in direct proximity to and along the optically effective surface of the reflective optical element, and wherein a thickness and/or positioning of the at least one filament are/is selected to minimize an optical influence of the at least one filament in the far field of the EUV radiation reflected by the optically effective surface,
wherein the at least one filament extends at least substantially radially between a center of the optically effective surface and a radially outer edge region of the optically effective surface, and
wherein the reflective optical element is arranged upstream of a facet mirror during operation in a lithography apparatus, wherein the facet mirror comprises facets having a larger dimensioning in a first direction than in a second direction perpendicular to the first direction, and wherein the at least one filament extends at least substantially parallel to the first direction of the facets.

2. The arrangement as claimed in claim 1, wherein the thickness of the at least one filament is less than 3 mm.

3. The arrangement as claimed in claim 1, wherein the at least one filament is arranged at a distance in a range of 5 mm to 50 mm from the optically effective surface.

4. The arrangement as claimed in claim 1, wherein the filament arrangement comprises a plurality of filaments arranged in a manner distributed uniformly along the optically effective surface.

5. The arrangement as claimed in claim 1, wherein the at least one filament extends along a region of the optically effective surface which reflects a part of the EUV radiation that is not used in the far field.

6. The arrangement as claimed in claim 1, wherein the at least one filament is configured as a resistance heating element.

7. The arrangement as claimed in claim 6, wherein the at least one filament is connected to at least one electrical supply conductor for supplying the filament with electric current.

8. The arrangement as claimed in claim 7, wherein the at least one supply conductor is configured as a holder for the at least one filament.

9. The arrangement as claimed in claim 7, wherein the at least one supply conductor extends along the optically effective surface radially between a center and a radially outer edge region of the optically effective surface.

10. The arrangement as claimed in claim 7, wherein the at least one supply conductor extends along the optically effective surface perpendicularly to the at least one filament.

11. The arrangement as claimed in claim 7, wherein the at least one supply conductor is arranged outside the optically effective surface.

12. The arrangement as claimed in claim 11, further comprising at least one holding element configured to hold the at least one filament, which extends along the optically effective surface.

13. The arrangement as claimed in claim 11, wherein the holding element is electrically insulated or electrically non-conductive.

14. The arrangement as claimed in claim 6, further comprising a voltage source configured to apply a bias voltage to the at least one filament.

15. The arrangement as claimed in claim 1, wherein the reflective optical element is a collector mirror of an EUV radiation source.

16. An extreme ultraviolet (EUV) lithography apparatus, comprising:
an illumination system comprising a plasma-forming radiation source configured to emit EUV radiation, and a plurality of mirrors configured to shape and direct the emitted EUV radiation onto a reflective object plane as illumination EUV radiation; and
a projection lens comprising a further plurality of mirrors configured to project the illumination EUV radiation into an image plane as projected EUV radiation,
wherein at least one of the mirrors is a facet mirror which comprises facets having a larger dimensioning in a first direction than in a second direction perpendicular to the first direction, and wherein the at least one filament extends at least substantially parallel to the first direction of the facets, and
wherein at least one further one of the mirrors comprises:
a reflective optical element arranged upstream of the facet mirror and having an optically effective surface arranged in a beam path of the emitted radiation, the shaped and directed radiation, the illumination radiation or the projected radiation, and configured to reflect the EUV radiation incident on the optically effective surface, and
a filament arrangement configured to produce a cleaning reagent sufficient to at least partly clean the optically effective surface, comprising:
at least one filament arranged in the beam path and extending transversely at least in part across the beam path, wherein the filament extends along and in unobstructed opposition to the optically effective surface and at a predetermined elevation from the optically effective surface, and
a voltage supply electrically connected to the at least one filament.

17. An arrangement for an extreme ultraviolet (EUV) lithography apparatus, comprising:
a reflective optical element having an optically effective surface configured to reflect incident EUV radiation, and
a filament arrangement configured to produce a reagent that cleans the optically effective surface, wherein the filament arrangement comprises at least one filament configured as a glow or heating element, wherein the at least one filament is arranged in direct proximity to and along the optically effective surface of the reflective optical element, and wherein a thickness and/or positioning of the at least one filament are/is selected to minimize an optical influence of the at least one filament in the far field of the EUV radiation reflected by the optically effective surface,
wherein the at least one filament extends at least substantially tangentially with respect to a center of the optically effective surface, and
wherein the reflective optical element is arranged upstream of a facet mirror during operation in a lithography apparatus, wherein the facet mirror comprises facets having a larger dimensioning in a first direction than in a second direction perpendicular to the first direction, and wherein the at least one filament extends at least substantially parallel to the first direction of the facets.

* * * * *

UNITED STATES PATENT AND TRADEMARK OFFICE
CERTIFICATE OF CORRECTION

| | | |
|---|---|---|
| PATENT NO. | : 11,231,658 B2 | Page 1 of 1 |
| APPLICATION NO. | : 16/882511 | |
| DATED | : January 25, 2022 | |
| INVENTOR(S) | : Kierey et al. | |

It is certified that error appears in the above-identified patent and that said Letters Patent is hereby corrected as shown below:

In the Specification

Column 3, Line 63, delete "surface" and insert -- surface. --.

Column 4, Line 7, delete "surface" and insert -- surface. --.

Signed and Sealed this
Fourteenth Day of March, 2023

Katherine Kelly Vidal
*Director of the United States Patent and Trademark Office*